(12) United States Patent
Baba

(10) Patent No.: US 6,614,863 B1
(45) Date of Patent: Sep. 2, 2003

(54) BIT SYNCHRONIZATION METHOD AND BIT SYNCHRONIZATION DEVICE

(75) Inventor: Mitsuo Baba, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/455,946

(22) Filed: Dec. 7, 1999

(30) Foreign Application Priority Data

Dec. 7, 1998 (JP) ............................................ 10-347633

(51) Int. Cl.[7] .................................................. H03L 7/00
(52) U.S. Cl. ........................ 375/359; 327/152; 375/371
(58) Field of Search ................................ 375/354, 359, 375/360, 371, 373, 375; 327/141, 144, 152, 153, 154, 161, 162

(56) References Cited

U.S. PATENT DOCUMENTS

| | | | | |
|---|---|---|---|---|
| 5,509,037 A | * | 4/1996 | Buckner et al. | 375/371 |
| 6,002,731 A | * | 12/1999 | Aoki et al. | 375/371 |
| 6,373,911 B1 | * | 4/2002 | Tajima et al. | 375/375 |
| 6,404,833 B1 | * | 6/2002 | Takebe | 375/371 |

FOREIGN PATENT DOCUMENTS

| | | |
|---|---|---|
| JP | 59-63835 | 4/1984 |
| JP | 62-43919 | 2/1987 |
| JP | 3-117129 | 5/1991 |
| JP | 5-344112 | 12/1993 |
| JP | 9-233061 | 9/1997 |
| JP | 10-247903 | 9/1998 |
| JP | 11-215110 | 8/1999 |

OTHER PUBLICATIONS

Japanese Office Action dated Jul. 23, 2002, with partial English translation.

* cited by examiner

Primary Examiner—Amanda T. Le
(74) Attorney, Agent, or Firm—McGinn & Gibb, PLLC

(57) ABSTRACT

A bit synchronization device which extracts an output data signal and an output clock signal from an input data signal on the basis of a multi-phase clock signal. The bit synchronization device is provided with a processing circuit which holds a phase corresponding to a change point of an input data signal with a multi-phase clock signal, and while the input data has a phase without change point, carrying out a data identification free from an error by selecting a clock signal corresponds to the phase without change point.

21 Claims, 12 Drawing Sheets

FIG. 8

| | DETECTION SIGNAL HOLDING SIGNAL:S211 | | | | | | | | HELD PHASE SIGNAL:S14 | | | | | | | |
|---|---|---|---|---|---|---|---|---|---|---|---|---|---|---|---|---|
| | 1 | 2 | 3 | 4 | 5 | 6 | 7 | 8 | 1 | 2 | 3 | 4 | 5 | 6 | 7 | 8 |
| EXAMPLE 1 | 1 | 0 | 1 | 0 | 0 | 0 | 0 | 1 | 1 | 1 | 1 | 0 | 0 | 0 | 0 | 1 |
| EXAMPLE 2 | 1 | 0 | 0 | 0 | 0 | 1 | 0 | 1 | 1 | 0 | 0 | 0 | 0 | 1 | 1 | 1 |
| EXAMPLE 3 | 1 | 1 | 0 | 0 | 0 | 0 | 1 | 0 | 1 | 1 | 0 | 0 | 0 | 0 | 1 | 1 |

FIG. 9

| | HELD PHASE SIGNAL:S14 | | | | | | | | IDENTIFICATION PHASE CONVERSION SIGNAL:S311 |
|---|---|---|---|---|---|---|---|---|---|
| | 1 | 2 | 3 | 4 | 5 | 6 | 7 | 8 | |
| EXAMPLE 1 | 1 | 1 | 0 | 0 | 0 | 0 | 0 | 1 | 5 |
| EXAMPLE 2 | 0 | 0 | 0 | 1 | 1 | 1 | 1 | 1 | 2 |
| EXAMPLE 3 | 0 | 0 | 1 | 1 | 1 | 1 | 1 | 0 | 1 |
| EXAMPLE 4 | 1 | 1 | 0 | 0 | 0 | 1 | 1 | 1 | 4 (or 5) |
| EXAMPLE 5 | 1 | 1 | 1 | 1 | 1 | 1 | 0 | 0 | 7 (or 8) |

BIT SYNCHRONIZATION METHOD AND BIT SYNCHRONIZATION DEVICE

BACKGROUND OF THE INVENTION

1. Field of the Invention

The present invention relates to a bit synchronization method and a bit synchronization device for extracting an output data signal and an output clock signal from an input data signal with a multi-phase clock signal, and more particularly to a bit synchronization method and a bit synchronization device for holding a phase of a change point of an input date signal with a multi-phase clock signal and selecting a clock signal having a phase free from the change point for the execution of the data identification.

2. Description of the Related Art

Conventionally, in a data transmission/reception used in a wide band ISDN (B-ISDN) or the like, it is required to receive a digital transmission signal in which phase variation is generated without the generation of an error in data identification. In such a digital transmission, synchronization is established with the same clock signal from a clock signal supply source to transmit data. As such a bit synchronization device, there is known an example in which a digital phase locked loop (DPLL) is used for taking bit synchronization with a multi-phase clock signal.

As such a bit synchronization device, Japanese Patent Application Laid-Open (JP-A) No. 62-43919 describes "a PLL circuit based on a multi-phase clock". In this conventional example, a phase comparison value between the received data and an extracted clock signal extracted with a closed loop is counted up and down thereby selecting an extracted clock signal from multi-phase clock signals which have the same frequency at this count value and which have phases shifted every N number. Thus, the extracted clock signals are obtained which are synchronized in phase with the received data by repeating the series of operations.

It sometimes happens that such a bit synchronization circuit is put in an abnormal oscillating state in a positive feedback thereof without the convergence of the phase synchronization operation by delay of the closed loop. Furthermore, when received data having a jitter (a short cycle phase shift) generated therein is input, the synchronization between the received data and the extracted clock signal is broken.

In other words, in an example in which such a PLL circuit is used, a jitter which is overlapped on the input data transmission is transmitted to the extracted clock signal. As a consequence, a jitter is generated in the extracted clock signal due to an influence of the input data, and furthermore the jitter is amplified and an abnormally oscillating state is generated in some cases. Therefore, the jitter is generated in the extracted clock signal with the result that a phase margin is reduced by the jitter portion as compared with an identification phase margin with respect to the actual input data. As a consequence, in identification data in a high-speed operation and in an environment in which the amount of noises is much the data identification becomes difficult.

As a proposal for solving the problems caused by such a closed loop, the Japanese Patent Application Laid-Open (JP-A) No. 9-233061 describes a "bit synchronization circuit". In this conventional example, phase synchronization is taken on the basis of the result of the phase comparison between received data and the multi-phase clock signal, and a delay in the phase synchronization operation is prevented by an open loop configuration. That is, an abnormally oscillating state is prevented from being generated by a high-speed convergence with the open loop configuration. Also, since the extracted clock signal and the received data can be output from the multi-phase clock signal with an average value of the phases of the result of the phase comparisons from the past up to the present, the extracted clock in which the phase synchronization is established can be obtained, even when received data with a jitter is input. consequently, the received data with no timing error can be output.

However, in "the bit synchronization circuit" described in the Japanese Patent Application Laid-Open (JP-A) No. 9-233061, a phase comparison between the received data and the multi-phase clock signal is performed so that a jitter is generated in the phase comparison output. In other words, there remains a room for improvement to be made on such a bit synchronization circuit in order to obtain more stable and more accurate output data signal and output clock signal from the input data signal.

SUMMARY OF THE INVENTION

An object of the present invention is to provide a bit synchronization method and a bit synchronization device which are capable of performing data identification free from an error irrespective of a jitter amplitude and a jitter frequency of an input data signal and a duty depreciation amount, and which are capable of obtaining stable and accurate output data signal and output clock signal from the input signal in which there is no frequency dependency in the jitter transmission characteristic to the output clock signal extracted from the input data signal and an abnormally oscillating state as will occur in the jitter amplification is not generated.

According to one aspect of the present invention, a bit synchronization method in which an output signal and an output clock signal are extracted from an input data signal based on a multi-phase clock signal comprises the steps of: outputting a logical value indicating a phase of a multi-phase clock signal corresponding to a phase of a change point detected from an input data signal; and holding the logical value and outputting a held phase signal in which the logical value is interpolated between logical values of a former and a latter. The method further comprises the steps of: outputting an identification phase signal in which a phase free from an identification error is determined from the multi-phase clock signal based on the held phase signal; outputting an output clock signal selected from the multi-phase clock signal corresponding to a phase indicated by the identification phase signal; outputting an output data signal in which the input data signal is identified based on the output clock signal; and releasing the held logical value and outputting a signal for determining an identification phase at a time of outputting the identification phase signal after a lapse of a definite period of time in a case where a total number of phases in which the change points are detected exceeds a set value.

According to another aspect on the present invention, a bit synchronization device which extracts an output signal and an output clock signal from an input data signal based on a multi-phase clock signal comprises a processing circuit which holds a phase corresponding to a change point of an input data signal with a multi-phase clock signal, and while the input data has a phase without change point, carrying out a data identification free from an error by selecting a clock signal corresponds to the phase without change point.

Such a bit synchronization method and such a synchronization device according to the present invention hold the phase of the change point of the input data signal with the multi-phase clock signal, and identify the input data by selecting the clock signal having a phase free from the change point at the time of extracting the output data signal and the output clock signal from the input data signal with the multi-phase clock signal.

As a result, the data identification free from an error can be performed irrespective of the jitter amplitude, the jitter frequency, and the duty depreciation amount of the input data signal. Furthermore, the jitter transmission characteristic to the output signal extracted from the input data signal does not depend on the frequency, and an abnormally oscillating state as can be observed in the amplification of the jitter is not generated. Therefore, a stable and accurate output data and output clock signal can be obtained from the input data signal.

BRIEF DESCRIPTION OF THE DRAWINGS

FIG. 8 is a view showing an operation of a detection signal interpolating circuit 203.

FIG. 9 is a view showing an operation of an identification phase converting device 301.

DESCRIPTION OF THE PREFERRED EMBODIMENTS

Figure 1:
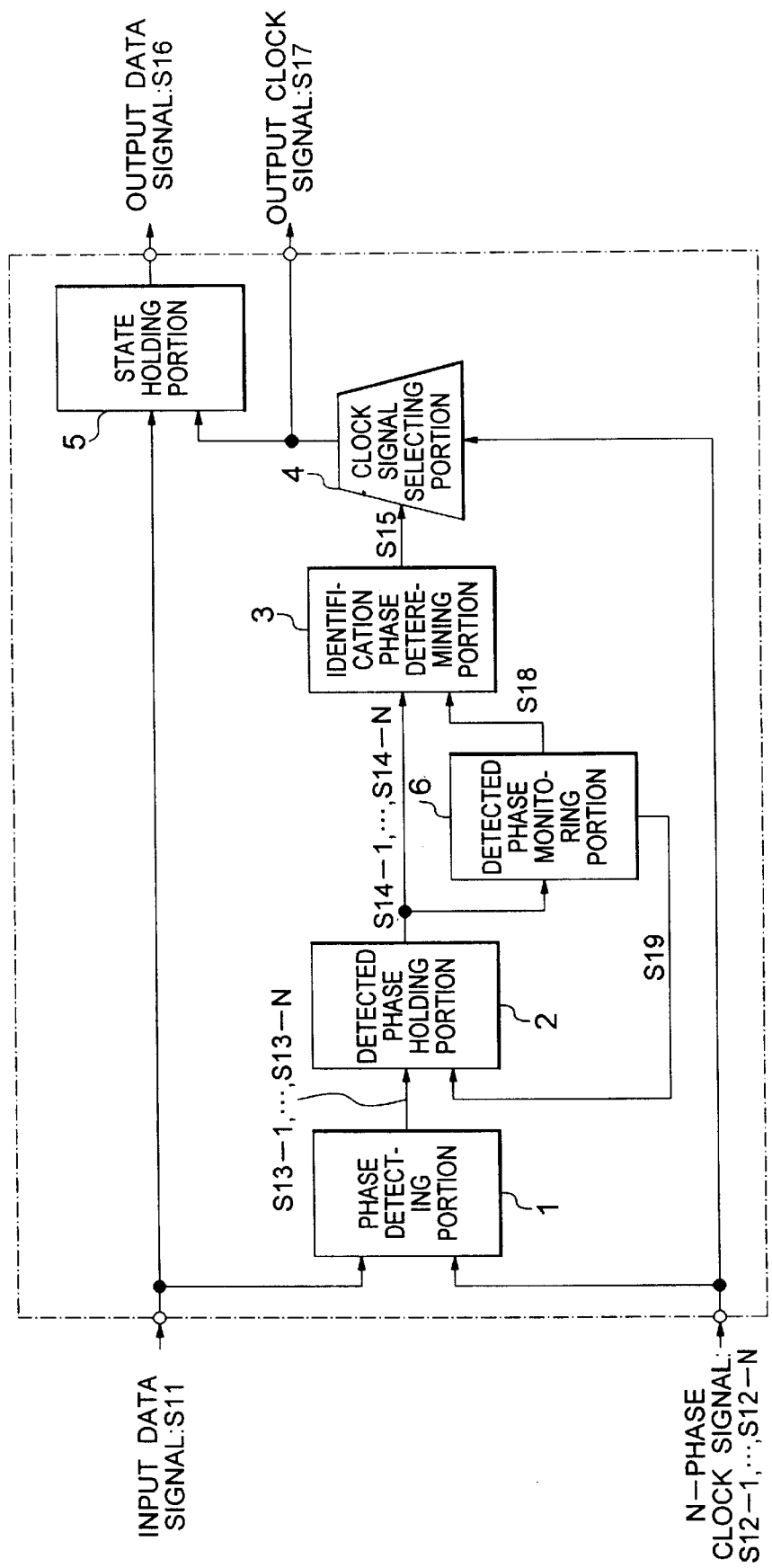
FIG. 1 is a block diagram showing a structure of a bit synchronization device according to the first embodiment of the present invention.

A bit synchronization method and a bit synchronization device according to embodiments of the present invention will be explained specifically hereinafter by referring to the accompanied drawings. FIG. 1 is a block diagram showing a structure of the bit synchronization device according to a first embodiment of the present invention.

In the first embodiment, there is provided a phase detecting portion 1 to which an input data signal S11 and N-phase clock signals S12-1, . . . , S12-N are input. Symbol N is an arbitrary integer which is three or more. The phase detecting portion 1 detects the phase of the change point of the input data signal S11 and outputs detection signals S13-1, . . . , S13-N indicative of the phase of the change point that is detected. A cycle of the N-phase clock signals S12-1, . . . , S12-N is substantially the same as the cycle of the input data signal S11. The phase of the N-phase clock signals S12-1, . . . , S12-N is shifted by a cycle of 1/N.

In the bit synchronization device, there is provided a detected phase holding portion 2 for inputting the detection signals S13-1, . . . , S13-N and outputting held phase signals S14-1, . . . , S14-N. Furthermore, there is provided a detected phase monitoring portion 6 for inputting the held phase signals S14-1, . . . , S14-N from the detected phase holding portion 2 and outputting a pulse-like hold releasing signal S19 and an identification phase control signal S18 which is rendered active in a certain period which is arbitrarily set. The hold releasing signal S19 is input to the detected phase holding portion 2 together with the detection signals S13-1, . . . , S13-N.

Still furthermore, there is provided the identification phase determining portion 3 for inputting a held phase signals S14-1, . . . , S14-N from the detected phase holding portion 2, and the identification phase control signal S18 from the detected phase monitoring portion 6, and outputting an identification phase signal S15. The identification phase signal S15 is a signal indicating the phase of the clock signal for identifying the data.

The bit synchronization device is provided with a clock signal selecting portion 4 for inputting the N-phase clock signals S12-1, . . . , S12-N and the identification phase signal S15 from the identification phase determining portion 3, and outputting an output clock signal S17 in which the clock signal of the phase to be identified is selected. Furthermore, there is provided a state holding portion 5 for inputting the input data signal S11, and the output clock signal S17 from the clock signal selecting portion 4, and outputting the output data signal S16 which is identified with the output clock signal S17.

Incidentally, the clock signal which is supplied to the detected phase holding portion 2, the identification phase determining portion 3 and the detected phase monitoring portion 6 is either of the output clock signal S17, the input data signal S11, and the output data signal S16.

Figure 2:
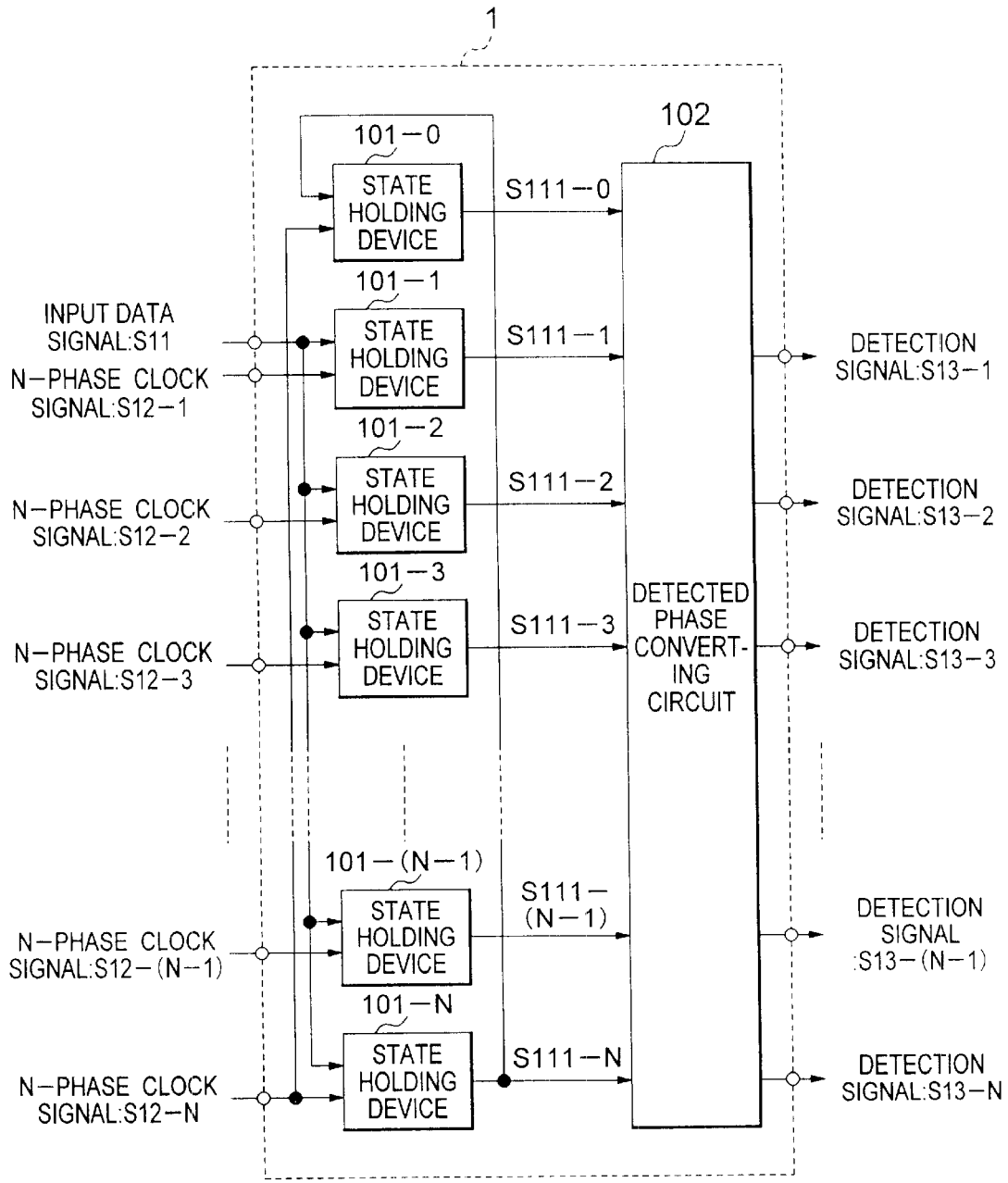
FIG. 2 is a block diagram showing a detailed structure of a phase detecting portion 1 in the first embodiment of the present invention.

FIG. 2 is a block diagram showing a detailed structure of a phase detecting portion 1 in the first embodiment of the present invention.

The phase detecting portion 1 is provided with state holding devices 101-1, . . . , 101-N for inputting the input data signal S11, the N-phase clock signals S12-1, . . . , S12-N and outputting state holding signals S111-1, . . . , S111-N respectively. The phase detecting portion 1 is provided with a state holding device 101-0 for inputting the state holding signal S111-N from the state holding device 101-N, and the N-phase clock signal S12-N and outputting the state holding signal S111-0. Furthermore, the phase detecting portion 1 is provided with a detected phase converting circuit 102 for inputting the state holding signals S111-0, . . . , S11-N, and outputting the detection signals S13-1, . . . , S13-N indicative of a phase of the change point which is detected from the input data signal S11.

Figure 3:
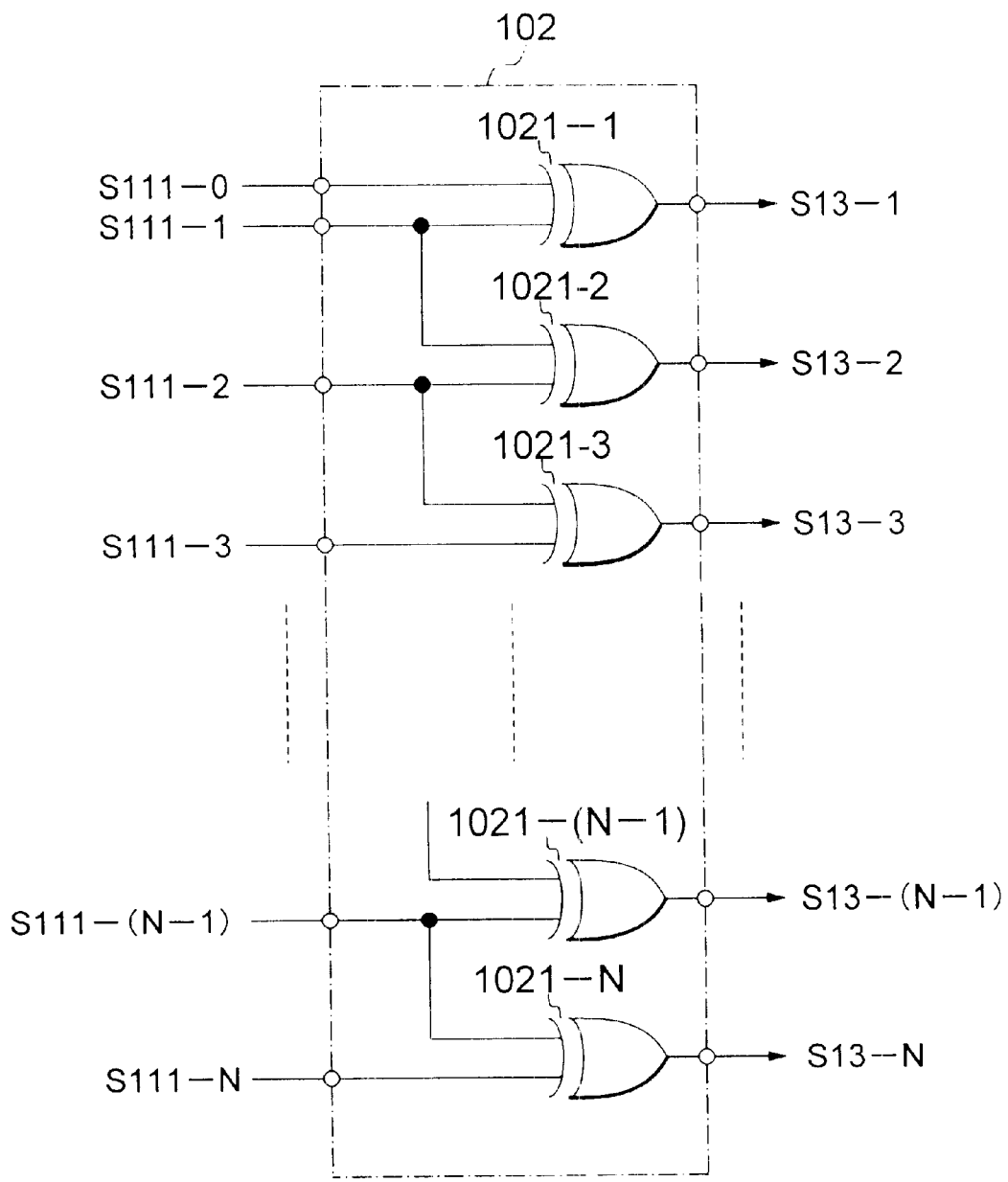
FIG. 3 is a block diagram showing a detailed structure of a detected phase converting circuit 102 in the first embodiment of the present invention.

FIG. 3 is a block diagram showing a detailed structure of the detected phase holding circuit 102 in the first embodiment of the present invention.

The detected phase converting circuit 102 is provided with an exclusive OR gate S1021-1 for outputting the detection signal S13-1 as an exclusive OR of the state holding signal S111-0 and S111-1. In the same way, the detected phase converting circuit 102 is also provided with an exclusive OR gate S1021-2 for outputting an exclusive OR (the detection signal S13-2) between the state holding signal S111-1 and S111-2, . . . , and an exclusive OR gate S1021-N for outputting an exclusive OR (the detection signal S13-N) between the state holding signal S111-(N-1) and S111-N.

Figure 4:
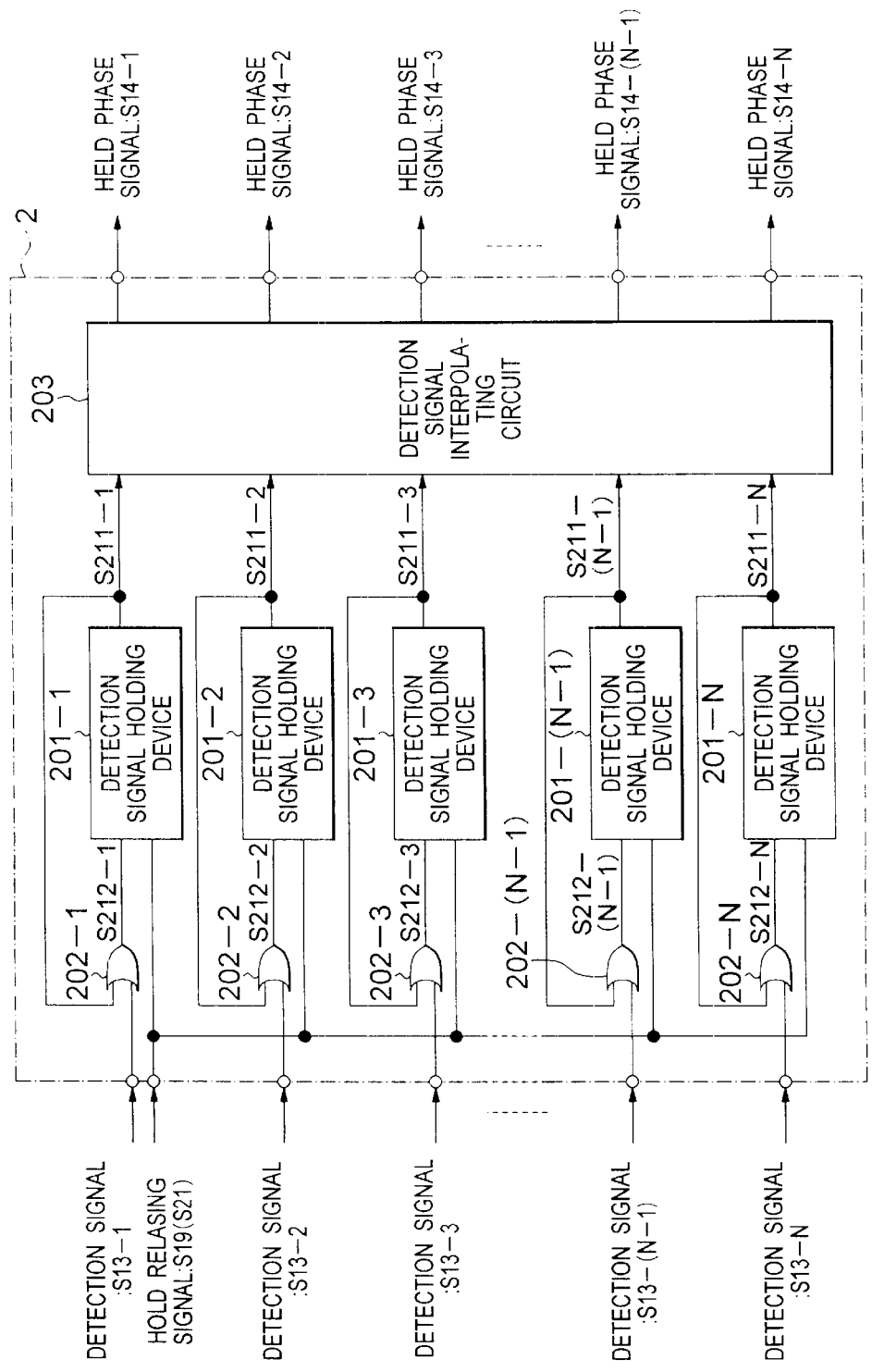
FIG. 4 is a block diagram showing a detailed structure of the detected phase holding portion 2 in the first embodiment of the present invention.

FIG. 4 is a block diagram showing a detailed structure of the detected phase holding portion 2 in the first embodiment of the present invention.

The detected phase holding portion 2 is provided with OR gates 202-1, . . . , 202-N for inputting detection signals S13-1, . . . , S13-N, and outputting OR output signals S212-1, . . . , S212-N respectively. The detected phase holding portion 2 is provided with detection signal holding devices 201-1, . . . , 201-N for inputting OR output signals S212-1, . . . , S212-N, respectively, and a hold releasing signal S19 and outputting detection/holding signals S211-1, . . . , S211-N, respectively. The detection/holding signals S211-1, . . . , S211-N are signals for holding the detection signal and are input to the other input end of the OR gates 201-1, . . . , 201-N. In other words, the OR gates 201-1, . . . , 201-N are circuits for outputting the OR of the detection signals S13-1, . . . , S13-N and the detection/holding signals S211-1, . . . , S211-N. Furthermore, the detected phase holding portion 2 is provided with a detection signal interpolating circuit 203 for inputting the detection/holding signals S211-1, . . . , S211-N and outputting the held phase signals S14-1, . . . , S14-N in which the detected phase has been interpolated.

Figure 5:
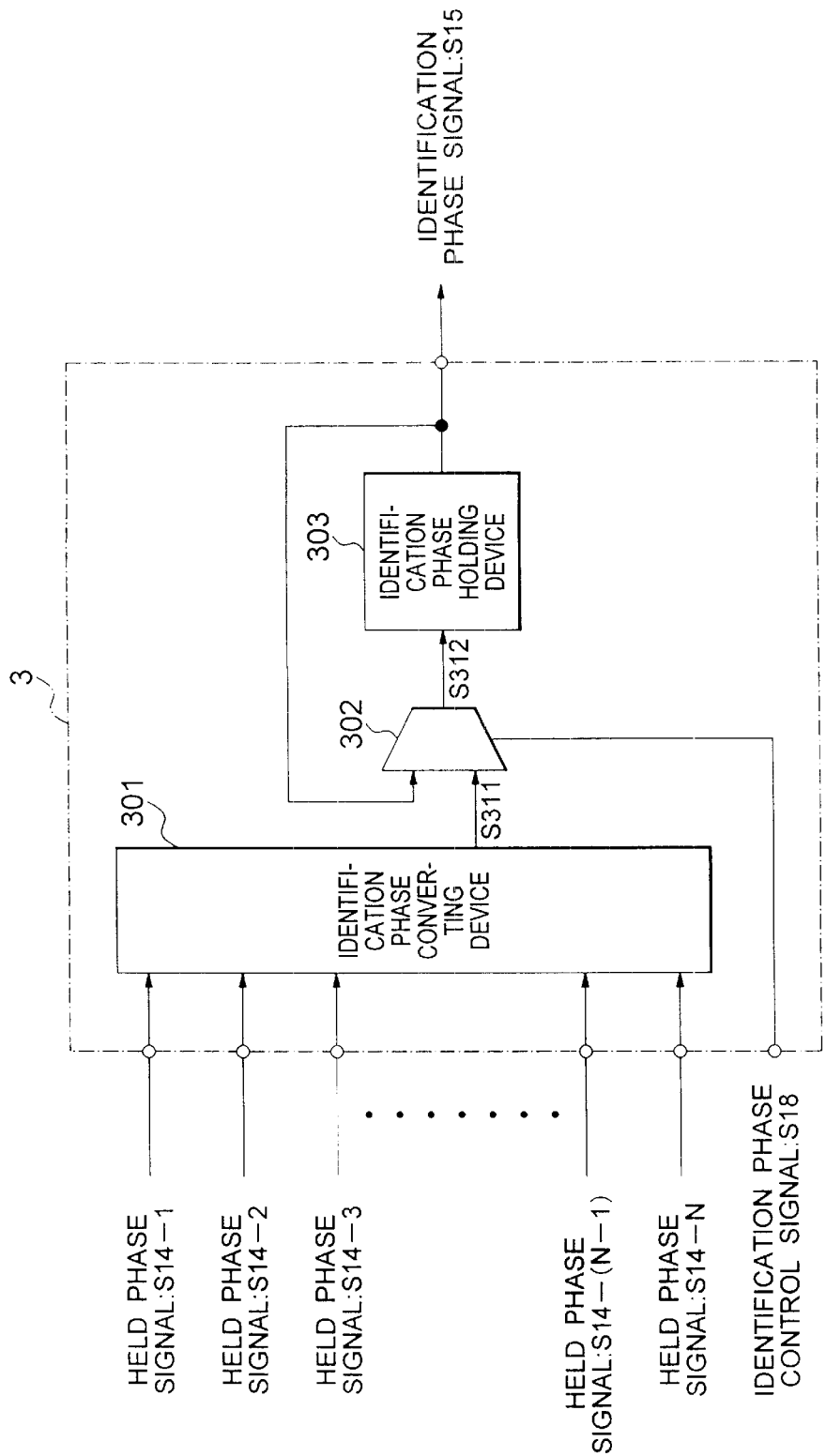
FIG. 5 is a block diagram showing a detailed structure of an identification phase determining portion 3 in the first embodiment of the present invention.

FIG. 5 is a block diagram showing a detailed structure of the identification phase determining portion 3 in the first embodiment of the present invention.

The identification phase determining portion 3 is provided with an identification phase converting device 301 for inputting the held phase signals S14-1, . . . , S14-N and outputting the identification phase conversion signal S311. The identification phase determining portion 3 is provided with an identification phase selector 302 for inputting the identification phase conversion signal S311 and outputting a post-selection identification phase signal S312 under the control of the identification phase control signal S18. Furthermore, the identification phase determining portion 3 is provided an identification phase holding device 303 for inputting the post-selection identification phase signal S312 and outputting the identification phase signal S15. The identification phase signal S15 is also input to the identification phase selector 302.

Figure 6:
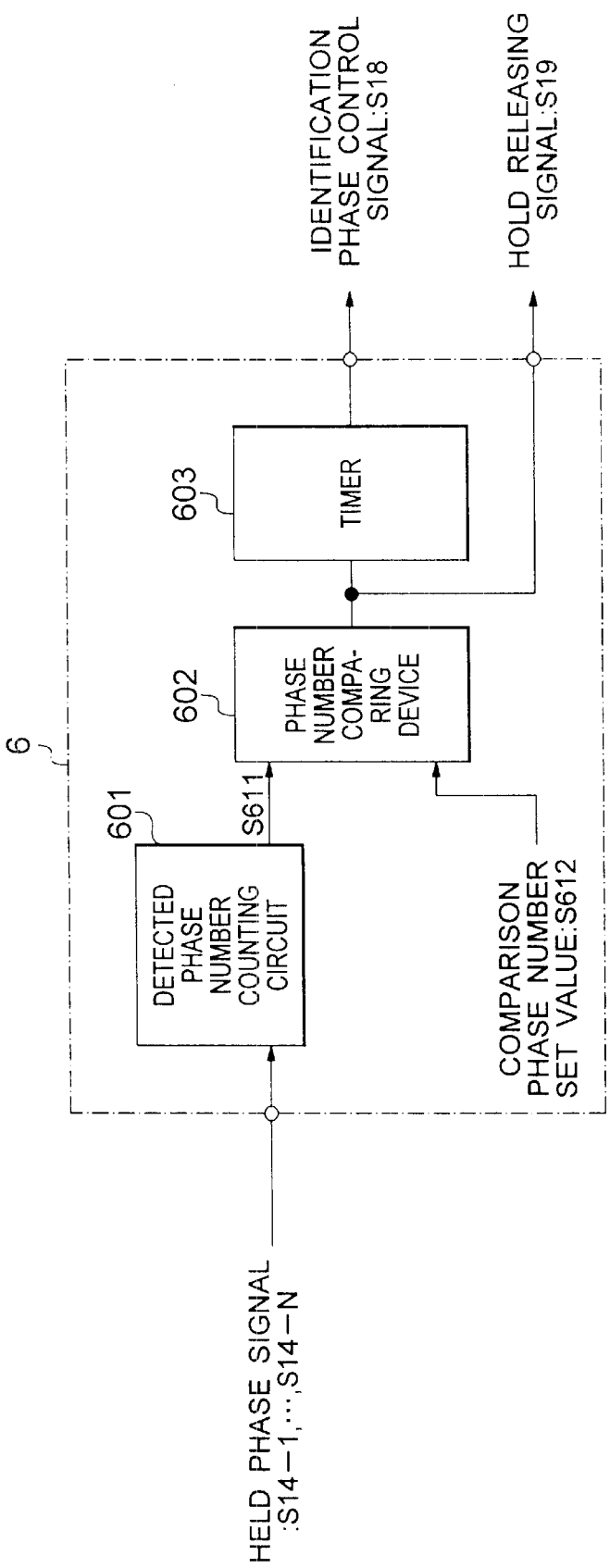
FIG. 6 is a block diagram showing a detailed structure of a detected phase monitoring portion 6 in the first embodiment of the present invention.

FIG. 6 is a block diagram showing a detailed structure of the detected phase monitoring portion 6 in the first embodiment of the present invention.

The detected phase monitoring portion 6 is provided with a detected phase number counting circuit 601 for inputting the held phase signals S14-1, . . . , S14-N and outputting a phase number counting signal S611. The detected phase monitoring portion 6 is provided with a phase number comparing device 602 for inputting a phase number counting signal S611 and a comparison phase number set value S612 of an arbitrary volume less than N and outputting the hold releasing signal S19. Furthermore, the detected phase monitoring portion 6 is also provided with a timer 603 for inputting a hold releasing signal S19 from the phase number comparing device 602 and outputting the identification phase control signal S18.

Incidentally, the detected phase holding device 2, the identification phase determining portion 3 and the detected monitoring portion 6 execute sequential logic. A clock signal in the processing of this sequential logic may use either of the output clock signal S17, the input data signal S11 and the output data signal S16.

Next, there is explained an operation of the first embodiment which is constituted in a manner as described above.

The bit synchronization device according to the first embodiment extracts an output data signal S16 and an output clock signal S17 from the input data signal S11 with the N-phase clock signals S12-1, . . . , S12-N (N is an arbitrary number of three or more).

When the input data signal S11, the N-phase clock signals S12-1, . . . , S12-N are input to the phase detecting portion 1, the phase detecting portion 1 detects the phase of the change point of the input data signal S11. Next, the phase detecting portion 1 detects as to which phase of the N-phase clock signals S12-1, . . . , S12-N the phase of the detected change point is most similar. Then, the phase detecting portion 1 outputs the logical value "1" corresponding to the most similar phase and the detection signal having the logical number "0" corresponding to the other phase.

When the detection signals S13-1, . . . , S13-N are input to the phase detecting portion 2, the detection signal having the logical value "1", which is phase information of the change point of the input data signal S11, is held. Then, only in the case where the hold releasing signal S19 is active, the held logical value of "1" is released to the logical value of "0". Therefore, in the phase where the change point has been detected even once in the detected phase holding portion 2, the logical value of "1" is held. In the phase where the change point has not been detected, the logical value of "0" is held. Furthermore, in the case where the phase before and after the held N phase has the logical value of "1" in the detected phase holding portion 2, the interpolation is performed for setting the logical value between the phases to "1". Thereafter, the held phase signals S14-1, . . . , S14-N are output, which are interpolated, from the detected phase holding portion 2.

In the identification phase determining portion 3, the held phase signals S14-1, . . . , S14-N are used to determine the phase of the clock signal in which an error in the data identification is not generated. The phase of the clock signal in which an error in the data identification is not generated is free from the change point of the input data signal S11. In the case where there are a plurality of phases free from the change point, the central phase thereof is selected. In other words, in the identification phase determining portion 3, the phase in which the logical value of "0" continues from the held phase signals S14-1, . . . , S14-N is detected and the central phase thereof is determined with the result that the central phase thereof is output from the identification phase determining portion 3 as the identification phase signal S15.

As the identification phase signal S15, in the case where the identification phase control signal S18 is active, the phase determined from the held phase signals S14-1, . . . , S14-N immediately before is held and output. In other cases except for the above, the phase which is determined from the current held phase signals S14-1, . . . , S14-N is output.

In the clock signal selecting portion 4, the clock signal having a phase indicated by the identification phase signal S15 is selected from the N-phase clock signals S12-1, . . . , S12-N, and the output clock signal S17 is output. On the other hand, in the state holding portion 5, the input data signal S11 is identified by using the output clock signal S17, and the identified output data signal S16 is output.

On the other hand, in the detected phase monitoring portion 6, the held phase signals S14-1, . . . , S14-N are monitored. When the total number of the phases in which the change point is detected exceeds the set value (an arbitrary set number), the pulse-like hold releasing signal S19 is output to the detected phase holding portion 2, and the identification phase control signal S18, which is active for a definite time (an arbitrary set time), is output to the identification phase determining portion 3. In this manner, in the case where the total number of the phases in which the change point is detected exceeds the set value, it is difficult to select the phase of the clock signal which can be normally identified with the result that it is judged with the detected phase monitoring portion 6 that the state is unusual so that the value which is held in the detected phase holding portion 2 is released. Incidentally, the fact that the identification phase control signal S18 is held with the identification phase determining portion 3 for a definite time is for the execution of the processing of determining the identification phase after a plurality of the change points of the input data signal S11 are detected.

Next, an operation of the essential portion according to the first embodiment will be explained further in detail. Hereinafter, let set the number of the phases of the N-phase clock signals S12-1, . . . , S12-N to 8 (N=8).

Figure 7:
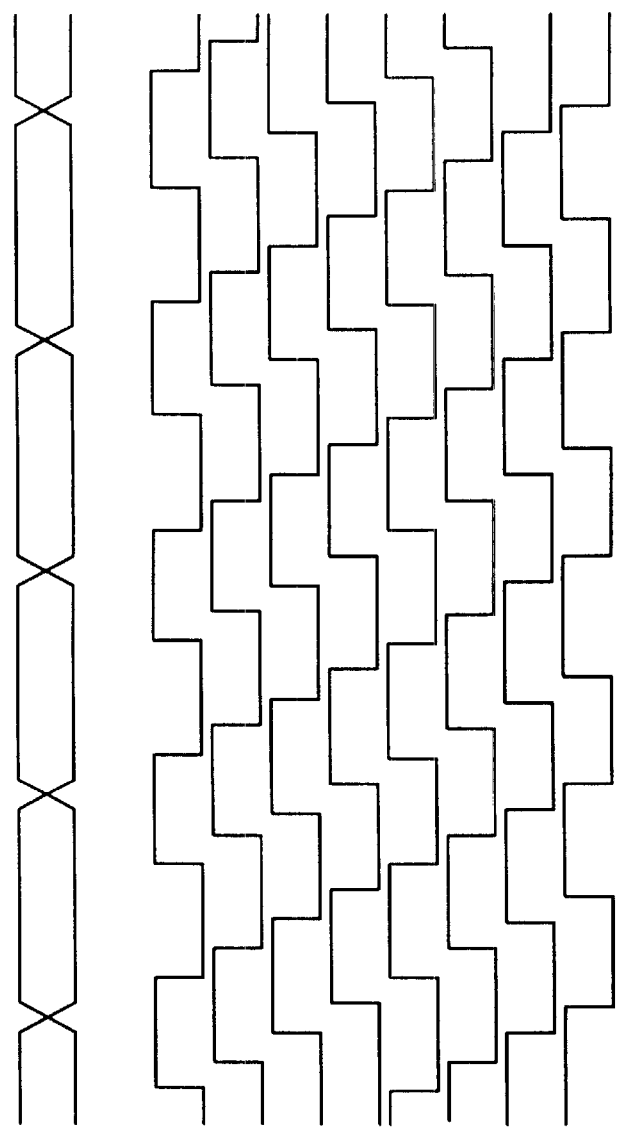
FIG. 7 is a timing chart showing a relation of an input data signal S11 and an N-phase clock signal S12-1, . . . , S12-N.

FIG. 7 is a timing chart showing a relation between the input data signal S11 and the N-phase clock signals S121, . . . , S12-N(8).

The phase detecting portion 1 detects where the phase of the change point of the input data signal S11 is present in the N-phase clock signals S12-1, . . . , S12-N(8). In the state holding devices 101-1, . . . , 101-N(8), the input data signal S11 is held in association with the N(8)-phase clock signals S12-1, . . . , S12-N(8). Then, the state holding signals S111-1, . . . , S111-N(8) and the state holding signals S111-1, . . . , S111-N(8) having the previous phase are input to the exclusive OR gates 1021-1, . . . , 1021-N(8) in the detected phase converting circuit 102.

As a consequence, at the change point at the rise of the input data signal S11, the state holding signals S111-1, . . . , S111-N(8) at the corresponding phase are set to a logical value of "1" while the state holding signals S111-1, . . . , S111-N(8) at the previous phase are set to the logical value of "0". On the other hand, at the change point of the fall of the input data signal S11, the state holding signals S111-1, . . . , S111-N(8) having a corresponding phase are set to a logical value of "0" while the state holding signals S111-1, . . . , S111-N(8) having a previous phase are set to a logical value of "1".

Consequently, the logical value of the detection signal having a phase corresponding to the change point of the rise of the input data signal S11 becomes "1" while the logical value of the detection signal having the other phase becomes "0". Incidentally, in the present embodiment, the detection state of the change point is set to a logical value of "1", but the same processing can be performed even when the logical value is set to "0".

With the detected phase holding portion 2, the logical value of "1" indicative the phase of the change point of the input data signal S11 detected with the phase detecting portion 1 is held. The held logical value of "1" is released to a logical value of "0" in the case where the hold releasing signal S19 is active. The logical value of "1" is held in other cases except for the above case.

As a consequence, the phase in which the change point has been detected even once, the logical value of "1" is held.

On the other hand, in the phase in which the change point has not been detected even once, the logical value of "0" is held.

Furthermore, in the case where either of the detection/holding signal having a phase prior to the K-phase has the logical value of "1" with respect to the detection/holding signal S211-1, . . . , S211-N(8) in which the N(8)-phase is held, and at the same time, either of the detection/holding signal having a phase after the K-phase has the logical value of "1", an interpolation for setting the logical value of the phase to "1" is executed by the detection signal interpolating circuit 203. Then, the held phase signals S14-1, . . . , S14-N (8) are output. At this time, the interpolation processing is executed on the basis of the supposition that a phase one phase before the first phase is the Nth (8th) phase, and a phase one phase after the Nth (phase 8) is the first phase. In other words, the interpolation processing is executed on the basis of the supposition that the Nth (8th) phase and the first phase continue one to the other. Symbol K is an integer less than N/2, namely an arbitrary natural number less than 4.

FIG. 8 is a view showing an operation of a detection signal interpolating circuit 203.

In FIG. 8, the k value is set to 1. In the Example 1, logical value of the detection/holding signal S211-2 is set to "0" before the processing, but the logical value is set to "1" through the interpolation processing. Consequently, the logical value of the held phase signal S14-2 is "1". In the same way, in the Example 2, the logical value of the detection/holding signal S211-7 is interpolated to "1". In the Example 3, the logical OR of the detection/holding signal S211-8 is interpolated to "1".

In the identification phase determining portion 3, using the held phase signals S14-1, . . . , S14-N(8), in the case where the phase of the clock signal in which no error in the data identification is generated is a phase of the input data signal S11 free from the change point, and phases free from the change point are present in plurality, the central phase thereof is selected. At this time, the phase in which the logical value of "0"s continues from the held phase signals S14-1, . . . , S14-N(8) are detected by the identification converting device 301, and the central phase thereof is determined. Incidentally, in the identification phase converting device 301, the processing is executed on the supposition that the Nth phase and the first phase continue.

FIG. 9 is a view showing an operation of the identification phase converting device 301.

In FIG. 9, there are described a held phase signals S14-1, . . . , S14-N(8) and an identification phase conversion signal S311 showing a phase which is determined from the held phase signals S14-1, . . . , S14-N(8).

In the Example 1, the logical value of the third phase to the seventh phase is "0" and the third phase to the seventh phase are phases in which the change point is not detected. In this case, the identification phase conversion signal S311 shows the fifth phase.

In the Example 2, the logical value of the first phase to the third phase is "0" and the first phase to the third phase are phases in which the change point is not detected. In this case, the identification phase conversion signal S311 shows the second phase.

In the Example 3, the logical value of the eighth phase to the second phase is "0" and the eighth phase to the second phase are phases in which the change point is not detected. In this case, the identification phase conversion signal S311 shows the first phase.

In the Example 4, the logical value of the third phase to the sixth phase is "0" and the third phase to the sixth phase are phases in which the change point is not detected. In this case, the identification phase conversion signal S311 shows the fourth or the fifth phase.

In the Example 5, the logical value of the seventh to the eighth phase is "0" and the seventh phase to the eighth phase are phases in which the change point is not detected. In this case, the identification phase conversion signal S311 shows the seventh or the eighth phase.

Incidentally, in the case where the identification phase control signal S18 is active, the phase determined from the previous held phase signals S14-1, . . . , S14-N (8) as the identification phase signal S15 is held and output. On the other hand, in other cases except for the above case, the phase which is determined from the present held phase signals S14-1, . . . , S14-N(8) is output.

In the clock signal selecting portion 4, the clock signal corresponding to the phase indicated by the identification phase signal S15 from the N-phase clock signals S12-1, . . . , S12-N(8) is selected. Then, the selected clock signal is output as the output clock signal S17.

In the state holding portion 5, the input data signal S11 is identified by using the output clock signal S17, and the output data S16 is sent out.

Figure 10:
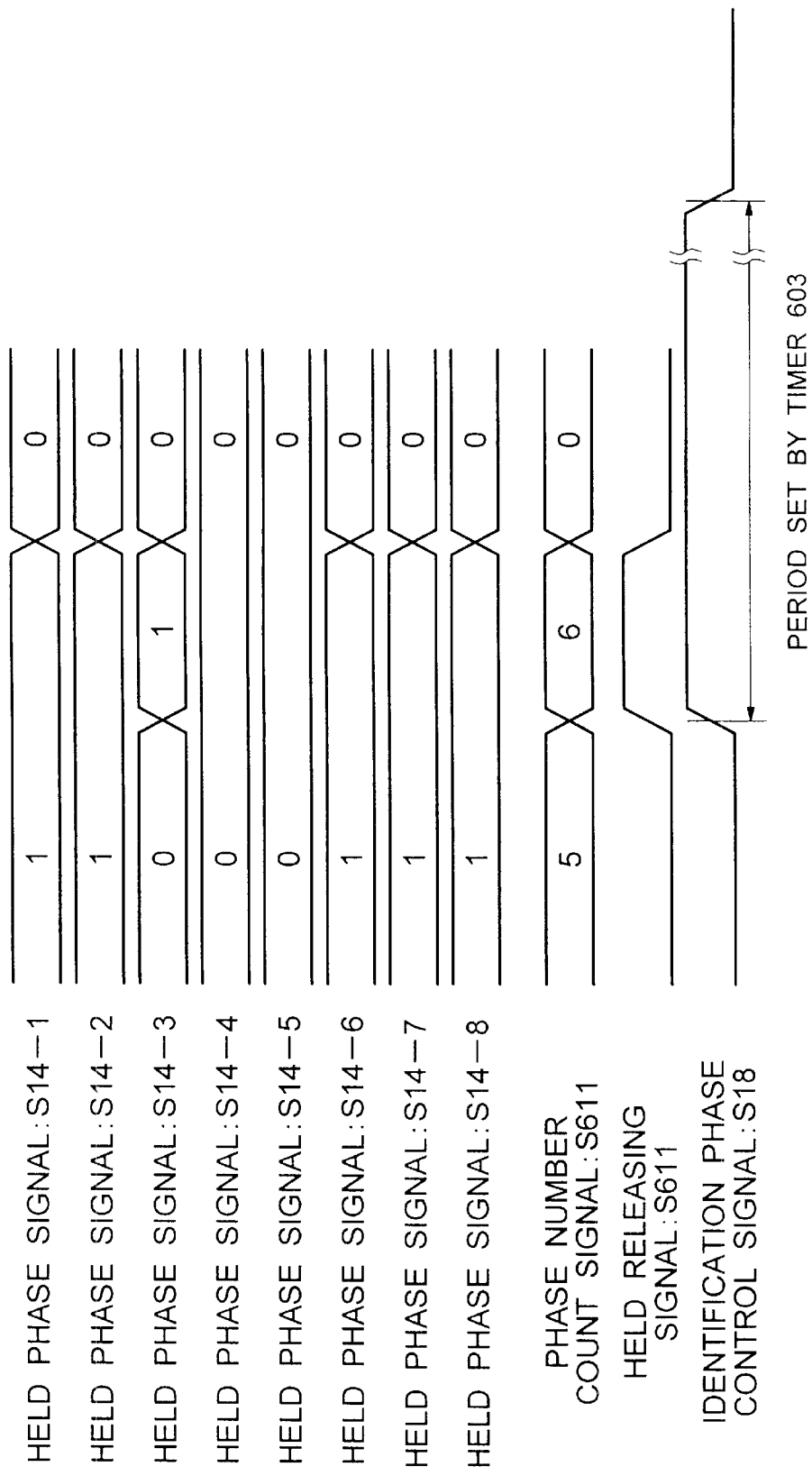
FIG. 10 is a timing chart showing an operation of the detected phase monitoring portion 6.

FIG. 10 is a timing chart showing an operation of the detected phase monitoring portion 6.

In the detected phase monitoring portion 6, the number of the phases is counted with the detected phase number counting circuit 601, and the phase number counting signal S611 showing the counted number is output. In this manner, the held phase signals S14-1, . . . , S14-N(8) from the detected phase holding portion 2 is monitored. Then, with the phase number comparing device 602, the phase number counting signal S611 and the comparison phase number set value S612 (a number less than N/2 which is arbitrarily set) are compared with each other. As a result of the comparison, when the number of the phases indicated by the phase number counting signal S611 exceeds the comparison phase number set value S612, a pulse-like hold releasing signal S19 is output to the detected phase holding portion 2.

In addition, in the detected phase monitoring portion 6, the identification phase control signal S18 which becomes active for a definite time (the time which is arbitrarily set) is output from the timer 603 to the identification phase determining portion 3. In other words, in the case where the total number of the phases in which the change point is detected exceeds the set value, it is difficult to select the phase of the clock signal which can be normally identified with the result that it is judged that the state is unusual, and the value of the detected phase holding portion 2 is released.

Incidentally, the fact that the identification phase control signal S18 is held in an active state is because the identification phase is determined after the change points of the input data signal S11 are detected in plurality.

FIG. 10 is a view showing an operation timing of the detected phase monitoring portion 6 in the case in which the comparison phase number set value S612 is set to 5. In this case, when the phase number counting signal S611 exceeds the comparison phase number set value S612 to be set to 6, the identification phase control signal S18 and the hold releasing signal S19 are output. As a consequence, the logical values of the held phase signals S14-1, . . . , S14-N(8) are all released to be "0" with the hold releasing signal S19.

Incidentally, the detected phase holding portion 2, the identification-determining portion 3, and the detected phase monitoring portion 6 execute the sequential logic. The clock signal in the processing of this sequential logic may be either of the output clock signal S17, the input data signal S11 and the output data signal S16.

Next, the second embodiment of the present invention will be explained hereinafter.

Figure 11:
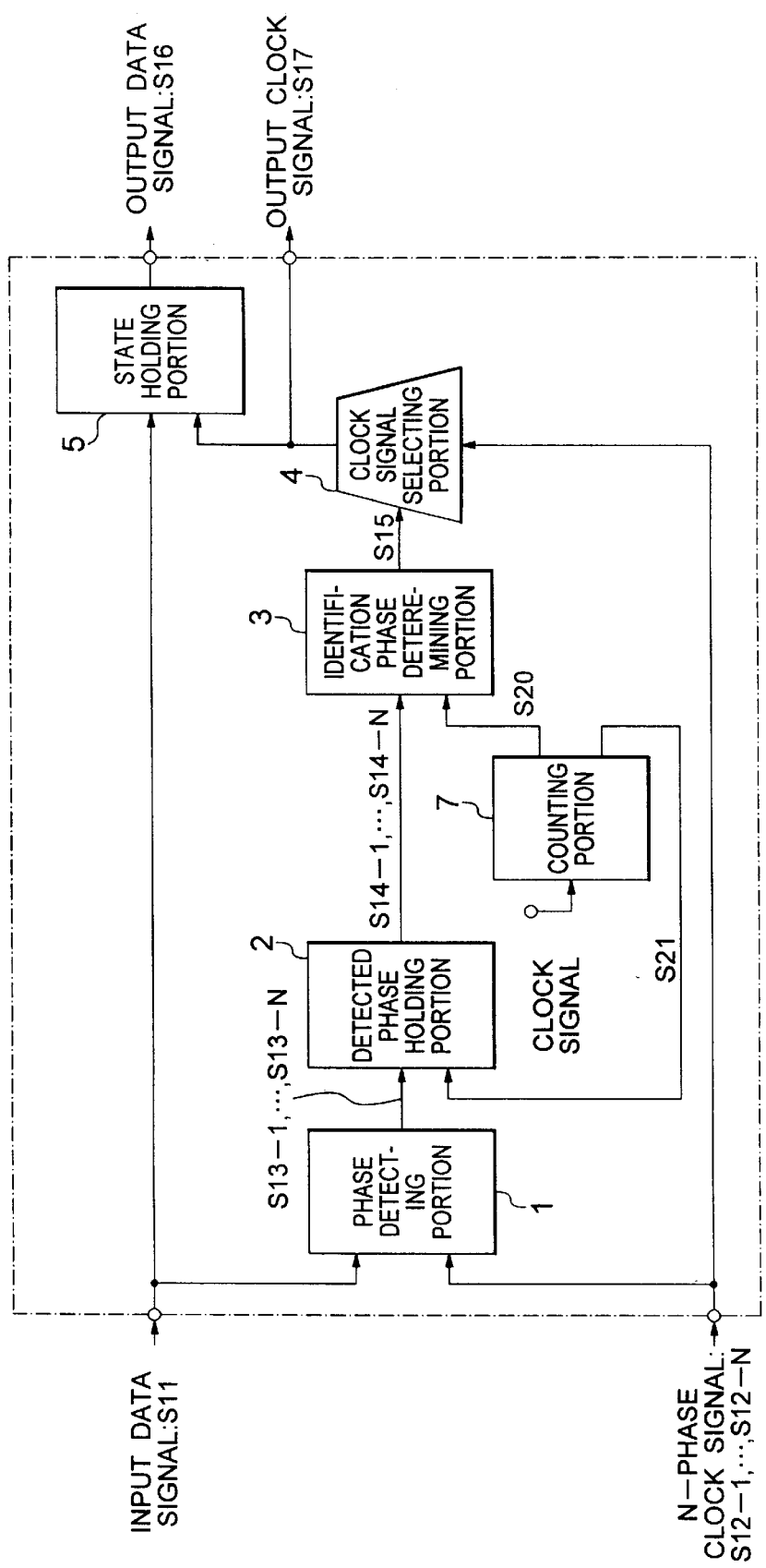
FIG. 11 is a block diagram showing a structure of a bit synchronization device according to a second embodiment of the present invention.

FIG. 11 is a block diagram showing a structure of a bit synchronization device according to the second embodiment of the present invention. In the second embodiment, a counting portion 7 is provided in the place of the detected phase monitoring portion 6 in the first embodiment shown in FIG. 1. The other structure is the same as that in the first embodiment. Consequently, in the second embodiment shown in FIG. 11, like constituent parts shown in FIG. 1 are denoted by like reference numerals, and a detailed explanation thereof is omitted.

In the second embodiment, there is provided a counting portion 7 for counting the clock signal (either of the output clock signal S17, an input data signal S11, or an output data signal S16). Then, every time the clock number attains the set cycle number (a value which is arbitrarily set), a pulse-like hold releasing signal S21 is output from the counting portion 7 to the detected phase holding portion 2, and a pulse-like identification phase control signal S20 is output to the identification phase determining portion 3.

In the second embodiment that is constituted in this manner, every time the clock number attains the set cycle number (a value which is arbitrarily set), the value of the held phase signals S14-1, . . . , S14-N in the detected phase holding portion 2 are released. Consequently, the identification phase signals S15 corresponding to the phase which is determined from the held phase signals S14-1, . . . , S14-N immediately before the release of the value are output only in the number of the set cycle. The other aspect of the operation is the same as the first embodiment.

Figure 12:
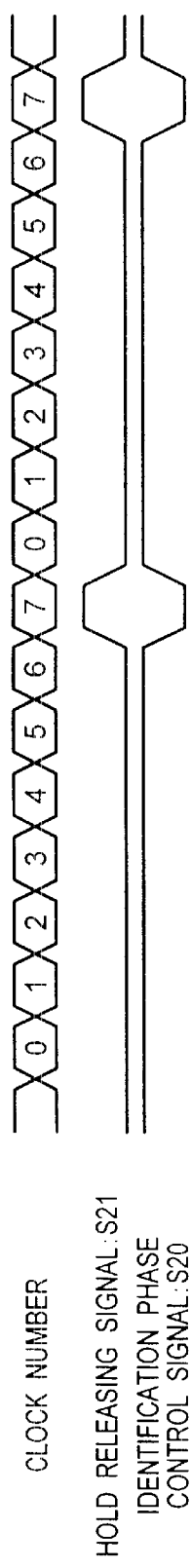
FIG. 12 is a timing chart showing an operation of a counting portion 7 according to the second embodiment of the present invention.

FIG. 12 is a timing chart showing an operation of the counting portion 7 in the second embodiment. For example, in the case where the set cycle number is set to 7, the hold releasing signal S21 and the identification phase control signal S20 are output every time the clock number attains 7.

Incidentally, in the second embodiment, in the same way as the first embodiment, the detected phase holding portion 2, the identification phase determining portion 3 and the counting portion 7 are operated in sequential logic. The clock signal in these operations may be either of the output clock signal S17, the input data signal S11, and the output data signal S16.

In this manner, in the bit synchronization device and the bit synchronization method, when the output data signal and the output clock signal is extracted from the input data signal with the multi-phase clock signal, the phase of the change point of the input data signal is held with the multi-phase clock signal so that the clock signal with a phase free from the change point is selected and the data identification is executed. As a consequence, the data identification free from an error can be made possible irrespective of the jitter amplitude, the jitter frequency and the amount of duty depreciation of the input data signal. Furthermore, the jitter transmission characteristic to the output clock signal extracted from the input data signal does not depend on the frequency, and an unusual oscillating state as seen in the case of the amplification of the jitter is not generated. Consequently, a stable and accurate output data signal and an output clock signal can be obtained from the input data signal.

What is claimed is:

1. A bit synchronization method in which an output signal and an output clock signal are extracted from an input data signal based on a multi-phase clock signal, said method comprising:

outputting a logical value indicating a phase of a multi-phase clock signal corresponding to a phase of a change point detected from an input data signal;

holding said logical value and outputting a held phase signal in which said logical value is interpolated between logical values of a former phase and a latter phase;

outputting an identification phase signal in which a phase free from an identification error is determined from said multi-phase clock signal based on said held phase signal;

outputting an output clock signal selected from said multi-phase clock signal corresponding to a phase indicated by said identification phase signal;

outputting an output data signal in which said input data signal is identified based on said output clock signal; and releasing said held logical value and outputting a signal for determining an identification phase at a time of outputting said identification phase signal after a lapse of a definite period of time in a case where a total number of phases in which said change points are detected exceeds a set value.

2. A bit synchronization method in which an output signal and an output clock signal are extracted from an input data signal based on a multi-phase clock signal, said method comprising:

outputting a logical value indicating a phase of a multi-phase clock signal corresponding to a phase of a change point detected from an input data signal;

holding said logical value and outputting a held phase signal in which said logical value is interpolated between logical values of a former phase and a latter phase;

outputting an identification phase signal in which a phase free from an identification error is determined from said multi-phase clock signal based on said held phase signal;

outputting an output clock signal selected from said multi-phase clock signal corresponding to a phase indicated by said identification phase signal;

outputting an output data signal in which said input data signal is identified based on said output clock signal; and releasing said held logical value and outputting said identification phase signals corresponding to a phase determined from said held phase signal immediately before said releasing of said held logical value in the same number as the set value every time a predetermined block signal attains said set value.

3. The bit synchronization method according to claim 2, wherein said predetermined clock signal comprises a kind of signal selected from a group comprising said input data signal, said output clock signal and said output data signal.

4. A bit synchronization device which extracts an output signal and an output clock signal from an input data signal based on a multi-phase clock signal comprising:

a processing circuit which holds a phase corresponding to a change point of an input data signal with a multi-phase clock signal, and while said input data has a phase without change point, carrying out a data identification free from an error by selecting a clock signal corresponds to said phase without change point.

5. The bit synchronization device according to claim 4, wherein a phase number of said multi-phase clock signal is N, a cycle of a clock signal in each phase of said multi-phase clock signal is substantially the same with a cycle of said input data signal, and a phase of a clock signal in each phase of said multi-phase clock signal is mutually shifted by 1/N circuit.

6. The bit synchronization device according to claim 4, wherein said processing circuit comprises:

a phase detection circuit which outputs a logical value indicating a phase of said multi-phase clock signal corresponding to a phase of a change point detected from said input data signal;

a detected phase holding circuit which holds said logical value and outputs a held phase signal in which said logical value is interpolated between logical values of a former and a latter;

an identification phase determining circuit which outputs an identification phase signal in which a phase free from an identification error is determined from said multi-phase clock signal based on said held phase signal;

a clock signal selecting circuit which outputs an output clock signal selected from said multi-phase clock signal corresponding to a phase indicated by said identification phase signal;

a state holding circuit which outputs an output data signal in which said input data signal is identified based on said output clock signal; and a detected phase monitoring circuit release said held logical value and outputs a signal for determining an identification phase at a time of outputting said identification phase signal after a lapse of a definite period of time in a case where a total number of phases in which said change points are detected exceeds a set value.

7. The bit synchronization device according to claim 6, wherein a phase of said clock signal free from generation of said data identification error is a phase free from a change point of said input data signal, and said identification phase determining circuit outputs, in a case where a plurality of phases free from said change point are present, an identification phase signal in which a central phase among said plurality of phases free from said change point.

8. The bit synchronization device according to claim 4, wherein the processing circuit comprises:

a phase detection circuit outputs a logical value indicating a phase of said multi-phase clock signal corresponding to a phase of a change point detected from said input data signal;

a detected phase holding circuit which holds said logical value and outputting a held phase signal in which said logical value is interpolated between logical values of a former and a latter;

an identification phase determining circuit which outputs an identification phase signal in which a phase free from an identification error is determined from said multi-phase clock signal based on said held phase signal;

a clock signal selecting circuit outputs an output clock signal selected from said multi-phase clock signal corresponding to a phase indicated by said identification phase signal;

a state holding circuit which outputs an output data signal in which said input data signal is identified based on said output clock signal; and a clock counting circuit which release said held logical value and outputs said identification phase signals corresponding to a phase determined from said held phase signal immediately before said releasing of said held logical value in the same number as the set value every time a predetermined clock signal attains said set value.

9. The bit synchronization device according to claim 6, wherein the phase detecting circuit comprises:

a plurality of state holding devices each of which outputs a state holding signal based on said input data signal and each phase of said multi-phase clock signal;

a state holding device outputs a state holding signal based on a signal having the last phase of said multi-phase clock signal and said state holding signal from a state holding device to which said last phase of said multi-phase clock signal is input; and a detected phase converting circuit which output a detection signal showing a phase of change point of said input data signal detected based on said state holding signal from said plurality of state holding devices and said latter state holding device.

10. The bit synchronization device according to claim 9, wherein said detected phase converting circuit has a plurality of exclusive logical OR gate which inputs all said state holding signals from said plurality of state holding devices and said latter state holding device and outputs said detection signal.

11. The bit synchronization device according to claim 9, wherein the detected phase holding circuit has:

a plurality of logical OR gate which inputs a plurality of detection signals respectively;

a plurality of detection signal holding devices which outputs a detection/holding signal based on said output signal from said logical OR gate respectively and a hold releasing signal, said detection/holding signal being input to a corresponding logical OR gate; and a detection signal interpolating circuit for outputting as a held phase signal a signal in which interpolation with respect to the detected phase is carried out on the basis of the plurality of detection signal/a hold signal.

12. The bit synchronization circuit according to claim 6, wherein said identification phase determining circuit has:

an identification phase converter which outputs an identification phase converting signal based on said held phase signal and said identification phase control signal;

an identification phase selector which outputs a post-selection identification phase signal based on said identification phase conversion signal;

an identification phase holding device which outputs an identification phase signal based on said post-selection identification phase signal, said identification phase signal being input to said identification phase selector.

13. The bit synchronization device according to claim 6, wherein said detected phase monitoring circuit has:

a detected phase counting circuit which outputs a phase number counting signal based on said held phase signal;

a phase number comparator inputs said phase number counting signal and a comparison phase number set value, said comparison phase number set value being an arbitrary natural number less than a number of said phase of said multi-phase clock signal, and outputs a hold releasing signal; and a timer which outputs an identification phase control signal based on said hold releasing signal.

14. The bit synchronization device according to claim 6, wherein one kind of signal selected from a group comprising said output clock signal, said input data signal and said output data signal is used as a clock signal at the time when said phase detecting circuit, said identification determining circuit, and said detected phase monitoring circuit execute sequential logic.

15. A method of bit synchronization which extracts an output signal and an output clock signal from an input data signal based on a multi-phase clock signal, said method comprising:

receiving input data signals and multiphase clock signals;

holding phase signals based on the received input data and the multiphase clock signals;

identifying the held phase signal that is free from an identification error using an identification phase control signal; and selecting the phase clock of the multi-phase clock signal using the phase signal that is free from error.

16. The method according to claim 15, further comprising:

outputting a logical value indicating a phase of a change point detected from the input data signals.

17. The method according to claim 15, further comprising:

outputting an output data signal in which the input data signal is identified based on the selecting of the phase clock.

18. The method according to claim 15, wherein the holding of said phase signals includes holding a logical value indicating a phase of a multi-phase clock signal corresponding to a phase of a change point detected from the input signal.

19. The method according to claim 15, wherein said holding of said signals further comprises outputting said held phase signals in which the logical value of each said signal is interpolated between logical values of a former phase and a latter phase.

20. The method according to claim 15, wherein the identifying of the held phase signal further comprises carrying out a data identification free from an error by selecting a clock signal corresponding to a phase without a change point.

21. A bit synchronization device which extracts an output signal and an output clock signal from an input data signal based on a multi-phase clock signal, comprising:

means for holding a phase corresponding to a change point of an input data signal with a multi-phase clock signal, and means for carrying out a data identification free from an error by selecting a clock signal corresponding to said phase without change point while said input data has a phase without change point.

* * * * *